United States Patent
Kanitz

(10) Patent No.: US 8,221,903 B2
(45) Date of Patent: Jul. 17, 2012

(54) MATERIALS FOR N-TYPE DOPING OF THE ELECTRON TRANSPORTING LAYERS IN ORGANIC ELECTRONIC DEVICES

(75) Inventor: Andreas Kanitz, Hoechstadt (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 876 days.

(21) Appl. No.: 12/065,859

(22) PCT Filed: Aug. 29, 2006

(86) PCT No.: PCT/EP2006/065752
§ 371 (c)(1),
(2), (4) Date: Aug. 12, 2008

(87) PCT Pub. No.: WO2007/028738
PCT Pub. Date: Mar. 15, 2007

(65) Prior Publication Data
US 2008/0297035 A1 Dec. 4, 2008

(30) Foreign Application Priority Data
Sep. 5, 2005 (DE) .......... 10 2005 042 104

(51) Int. Cl.
*H01L 51/52* (2006.01)
*C07D 471/02* (2006.01)
*C07D 409/02* (2006.01)
(52) U.S. Cl. .......... 428/690; 428/917; 313/502; 257/40; 546/37; 549/43; 549/59
(58) Field of Classification Search .......... None
See application file for complete search history.

(56) References Cited

U.S. PATENT DOCUMENTS

| 3,932,415 A * | 1/1976 | Reynolds .......... 546/37 |
| 2005/0040390 A1 | 2/2005 | Pfeiffer et al. |

FOREIGN PATENT DOCUMENTS

| DE | 103 07 125 A1 | 1/2004 |
| EP | 1 394 236 A1 | 3/2004 |
| JP | 2000-103975 | 4/2000 |
| JP | 2005-002290 A | 1/2005 |
| WO | WO 01/91203 A2 | 11/2001 |

OTHER PUBLICATIONS

G.E. Johnson et al., "Electroluminescence from single layer molecularly doped polymer films", 1995, Pure & Appl. Chem., vol. 67, No. 1, pp. 175-182.
Ansgar Werner et al., "n-Type Doping of Organic Thin Films Using Cationic Dyes", Mar. 2004, Advanced Functional Materials, 14, No. 3, pp. 255-260.
Valdes-Aguilera et al., "Aggregation Phenomena in Xanthene Dyes," Acc. Chem. Res., 1989, 22, 171-177.
Office Action dated May 11, 2011 in JP Pat. Appl. No. 2008/529598 (7 pages).

* cited by examiner

*Primary Examiner* — Lynda Salvatore
*Assistant Examiner* — Andrew K Bohaty
(74) *Attorney, Agent, or Firm* — Fish & Richardson P.C.

(57) ABSTRACT

The invention pertains to new materials based on donor carbene intermediates for the improvement of electron injection and electron transport in organic electronic components like organic light-emitting diodes (OLED's), organic field effect transistors (OFET's), and components based on organic photovoltaics, in particular organic solar cells.

15 Claims, No Drawings

MATERIALS FOR N-TYPE DOPING OF THE ELECTRON TRANSPORTING LAYERS IN ORGANIC ELECTRONIC DEVICES

TECHNICAL FIELD

The invention pertains to new materials for the improvement of electron injection and electron transport in organic components like organic light-emitting diodes (OLED's), organic field effect transistors (OFET's), and organic solar cells.

BACKGROUND

In recent years materials, in particular for organic light-emitting diodes, have become known, which improve the electron injection and the electron transport in OLED's. (Pat.: Novaled GmbH Dresden DE-10307125_A1 Jan. 8, 2004)

This also results in a lower operating voltage without affecting the efficiency of the OLED.

These materials are available as precursors and are converted into strong electron donors by the vapor depositing process, where, co-vaporized with the electron transporter, they are doped in small quantities into the electron-transporting layer or the emitter layer of the OLED (n-doping). This leads to an electronic interaction with the electron-transporting material or the emitter, which is the reason why such additions facilitate the reduction of the electron transporting material or the emitter material (i.e. acceptance of electrons into the LUMO [lowest unoccupied molecular orbital] of the electron-transporting or emitter material), which otherwise takes place due to the energy of the electric field only. Therefore, a weaker electric field (i.e. a lower operating voltage) achieves the same efficiency which without these materials could be provided only by a stronger electric field.

However, in the currently known materials, especially the stability and the injection and electron transport-facilitating effect is not satisfactory yet.

SUMMARY

It is therefore the objective of this invention to create a material for the improvement of the electron injection and/or the electron transport in organic components, which overcomes the disadvantages of the state of the art, and especially increases the currently lacking stability of the injection and electron transport-facilitating effect.

The solution to the problem and the object of the invention are disclosed in the claims, the embodiments and the description.

DETAILED DESCRIPTION

According to the invention, the injection- and electron transport-facilitating effect can be significantly increased by the new claimed materials of substructures 1-3 while their stability can also be improved by modified linkages.

The reasons are the bridging of the dialkylamino substituents to the aromatic nucleus in substructure 1 as well as the newly utilized redox-stable triarylamine donors of substructures 2 and 3, which on one hand complete the reaction to dimer tetra donor ethylenes (1a and 2a) or tetra donor fulvalenes (3a) by conversion via a carbene mechanism in a high-vacuum process; which in an electron acceptor matrix are immediately ready to transfer an electron or, on the other hand, are able to create from the carbene state directly with the acceptor matrix an electron-transferring, complex-type transitional state, the physical effect of which can be characterized but not its chemical structure.

Another option is to synthesize the tetra donor ethylenes (1a and 2a) or the tetra donor fulvalenes (3a) directly, and use them to dope the electron acceptor matrix.

Due to the triarylamine substituents, the materials of substructures 2 and 3 also exhibit good glass-formation properties, which also contribute to the improvement of the transport and the transfer of charges and thus to a higher conductivity of the electron-transporting/emitter layer.

Substructures of the Precursors (Carbenoids):

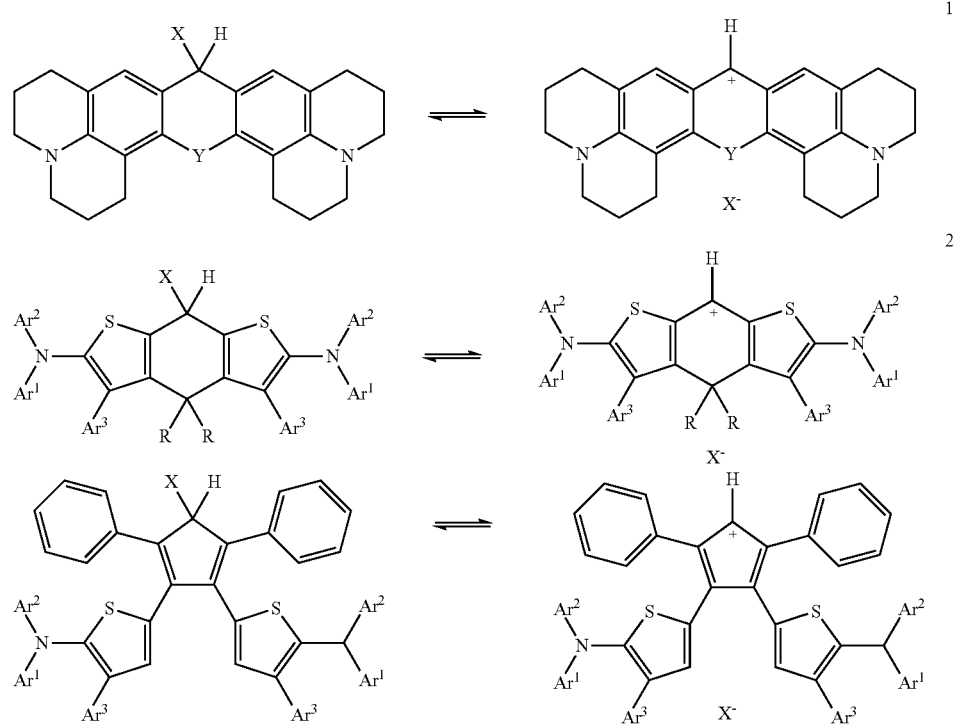

in which the substituents have the following relevances:

X has the relevance of an anion, preferably of chlorine and formiate,

Y stands for O, S or N—Ar, wherein Ar preferably represents a phenyl or 1-naphthyl, R represents an alkyl, preferably a methyl, Ar$^1$ to Ar$^3$ stand for aryl moities with a preferred relevance independent from each other of phenyl, 1-naphthyl and 2-naphthyl.

Substructures of the Carbene Dimers:

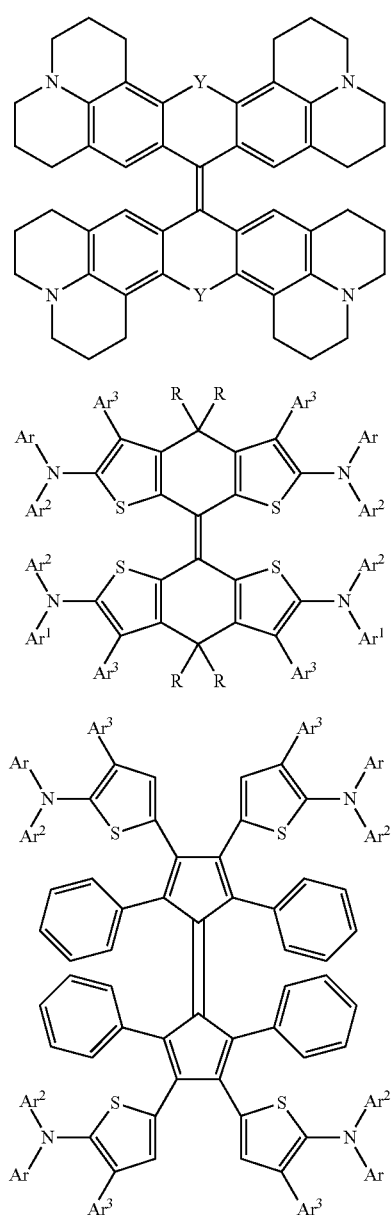

The new materials capable of improving electron transport and electron injection due to their chemical interaction with any electron-transporting and/or emitter layers can therefore be utilized universally and successfully in polymer-electronic components, including any technologies for the manufacture of organic light-emitting diodes (OLED's), organic field effect transistors (OFET's), and components based on organic photovoltaics like solar cells.

EMBODIMENTS

1) Synthesis of a Carbenoid 1

Synthesis by Vilsmeyer formylation of 8-hydroxyjulolidine and condensation to methine dye #1 in excess of 8-hydroxyjulolidine and addition of potassium chloride.

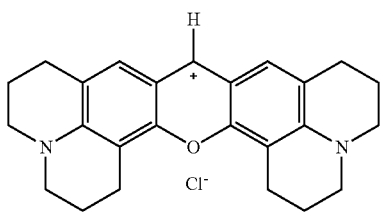

2) Synthesis of a Dimer 1a a) Synthesis of a Michler's ketone analog from 8-hydroxy-julolidine and diethylcarbonate.

b) Dimerization of the Michler's ketone analog by McMurry reaction.

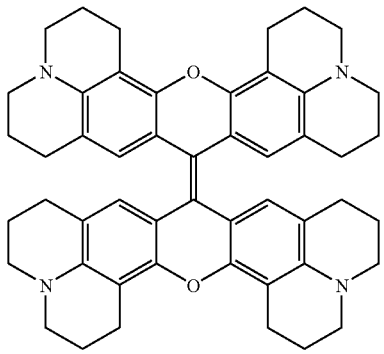

3) Synthesis of a Carbenoid 2 a) Synthesis of 2-phenyl acetic acid diphenylamide from diphenylamine and phenylacetic acid chloride b) Synthesis of 2-phenylthioacetic acid diphenylamide from 2-phenylacetic acid diphenylamide and Lawesson's reagent.

c) Synthesis of di[2-(diphenylamino)-3-phenyl-thien-4-yl]-dimethyl-methane from 2-phenylthioacetic acid diphenylamide and 1,5-dibromo-3,3-dimethyl-pentane-2,4-dion.

d) Vilsmeyer formylation of the di[2-(diphenylamino)-3-phenyl-thien-4-yl]-dimethyl-methane under formation of methine dye #2 and anion exchange via potassium chloride.

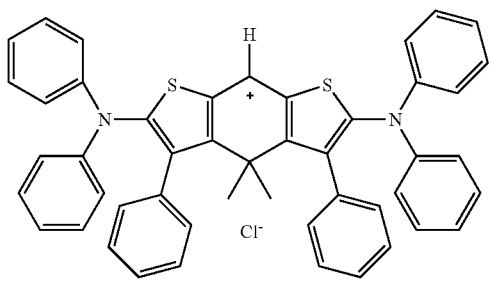

4) Synthesis of a Dimer 2a a) Synthesis of a Michler's ketone analog by reaction of di-[2-(diphenylamino)-3-phenyl-thien-4-yl]-dimethyl-methane 3c with diethylcarbonate.

b) Dimerization of the Michler's ketone analog 4a by McMurry reaction.

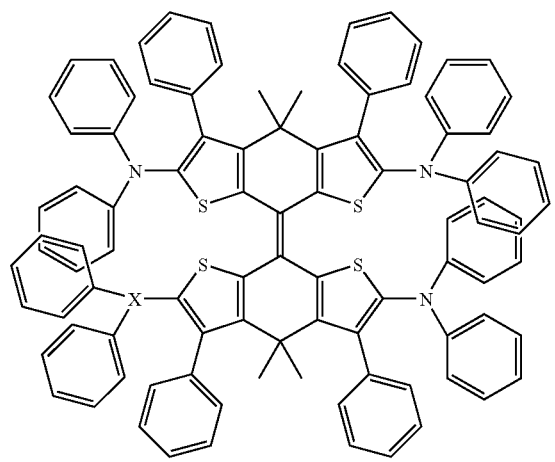

5) Synthesis of a Carbenoid 3 a) Synthesis of 2-phenylacetic acid phenyl-1-naphthylamide from phenyl-1-naphthylamine and phenylacetic acid chloride.

b) Synthesis of 2-phenylthioacetic acid phenyl-1-naphthylamide from 2-phenylacetic acid phenyl-1-naphthylamide and Lawesson's reagent.

c) Synthesis of 2-phenyl-3-mopholino-thioacrylic acid phenyl-1-naphthylamide from 2-phenylthioacetic acid phenyl-1-naphthylamide, morpholine and ortho formic acid ester.

d) Synthesis of 1,2-di-[2-(phenyl-1-naphthylamino)-3-phenyl-thien-5-yl]-ethane-1,2-dion from 2-phenyl-3-mopholino-thio-acrylic acid phenyl-1-naphthylamide and 1,4-bibromobutane-2,3-dion.

e) Condensation of 2,5-diphenyl-3,4-di-[2-(phenyl-1-naphthyl-amino)-3-phenyl-thien-5-yl]-cyclopentadienon from 1,2-di-[2-(phenyl-1-naphthylamino)-3-phenyl-thien-5-yl]-ethane-1,2-dion and 1,3-diphenylaceton with potassium-tert.-butylate.

f) Reduction of the 2,5-diphenyl-3,4-di-[2-(phenyl-1-naphthyl-amino)-3-phenyl-thien-5-yl]-cyclopentadienon to carbinol via sodium borohydride.

g) Formation of methine dye #3 from carbinol 5f with HCl.

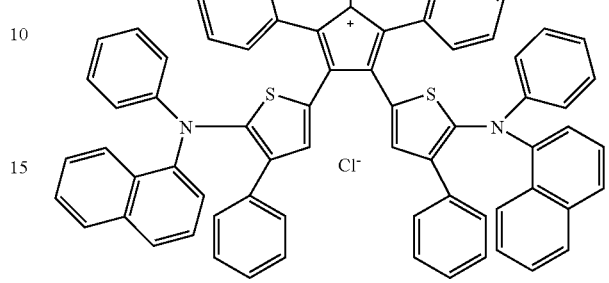

6) Synthesis of a Dimer 3a a) Dimerization of Michler's ketone analog 5e by McMurry reaction.

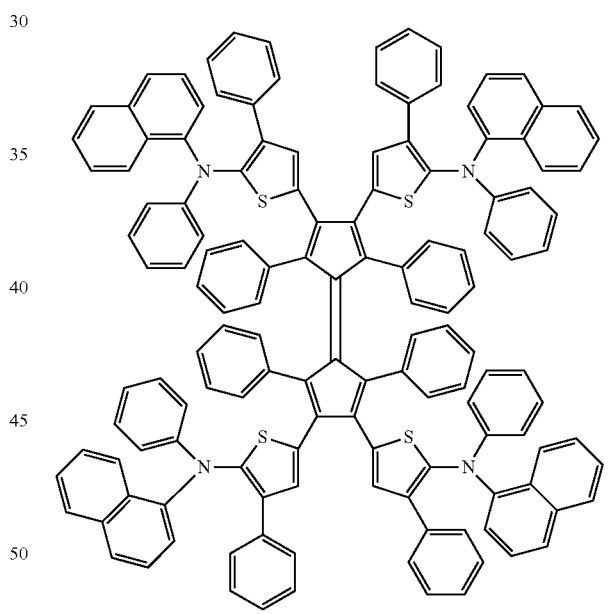

The invention pertains to new materials based on donor carbene intermediates for the improvement of the electron injection and electron transport in organic electronic components like organic light-emitting diodes (OLED's), organic field effect transistors (OFET's), and organic photovoltaic components, in particular organic solar cells.

The invention claimed is:

1. A material for the n-doping of the electron-transporting layer in organic electronic components, comprising at least one compound of structures 1 to 3:

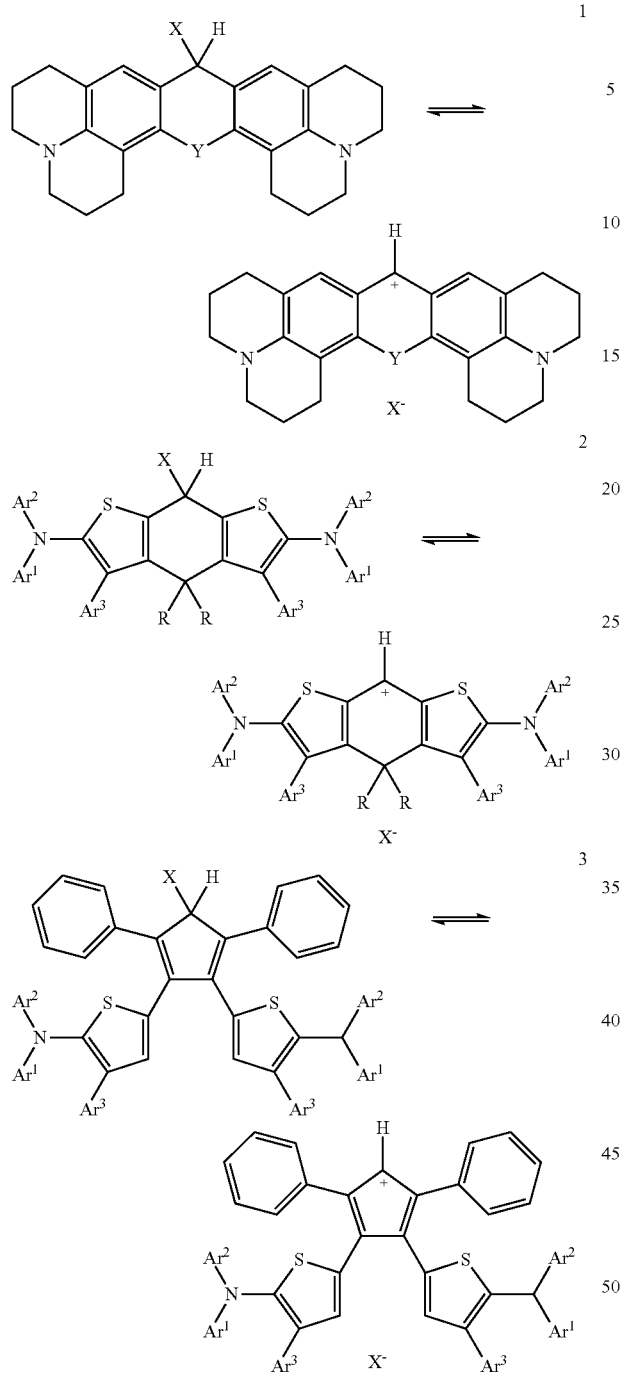

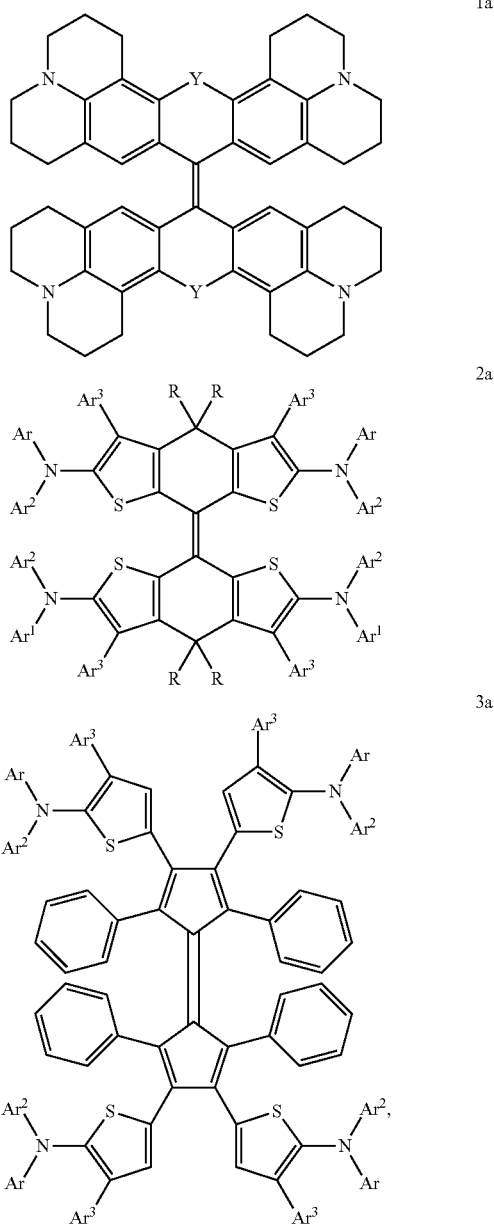

wherein:
X⁻ is an anion,
Y is S or N—Ar,
R is alkyl, and,
Ar¹, Ar², and Ar³ are each, independently, aryl moieties.

2. The material of claim 1, wherein X⁻ is chloride or formiate.

3. The material of claim 1, wherein the Ar in N—Ar is phenyl or 1-naphthyl.

4. The material of claim 1, wherein R is methyl.

5. The material of claim 1, wherein Ar¹, Ar², and Ar³ are each independently selected from the group consisting of phenyl, 1-naphthyl and 2-naphthyl.

6. A material for the n-doping of the electron-transporting layer in organic electronic components, the material comprising at least one compound of structures 1a to 3a:

wherein:
Y is S or N—Ar;
R is alkyl; and,
Ar¹, Ar², and Ar³ are each, independently, aryl moieties.

7. The material of claim 6, wherein the Ar in N—Ar is phenyl or 1-naphthyl.

8. The material of claim 6, wherein R is methyl.

9. The material of claim 6, wherein Ar¹, Ar², and Ar³ are each independently selected from the group consisting of phenyl, 1-naphthyl and 2-naphthyl.

10. An organic electronic component comprising at least two electrodes and an active layer, wherein located between at least one electrode and the active layer is an electron-transporting layer doped with a material of any one of claims 1, 2, or 3-9.

11. A process for manufacturing one of the materials of claims 6 to 9, wherein a compound of one of structures 1 to 3 is converted in high-vacuum to a corresponding compound of one of structures 1a to 3a:

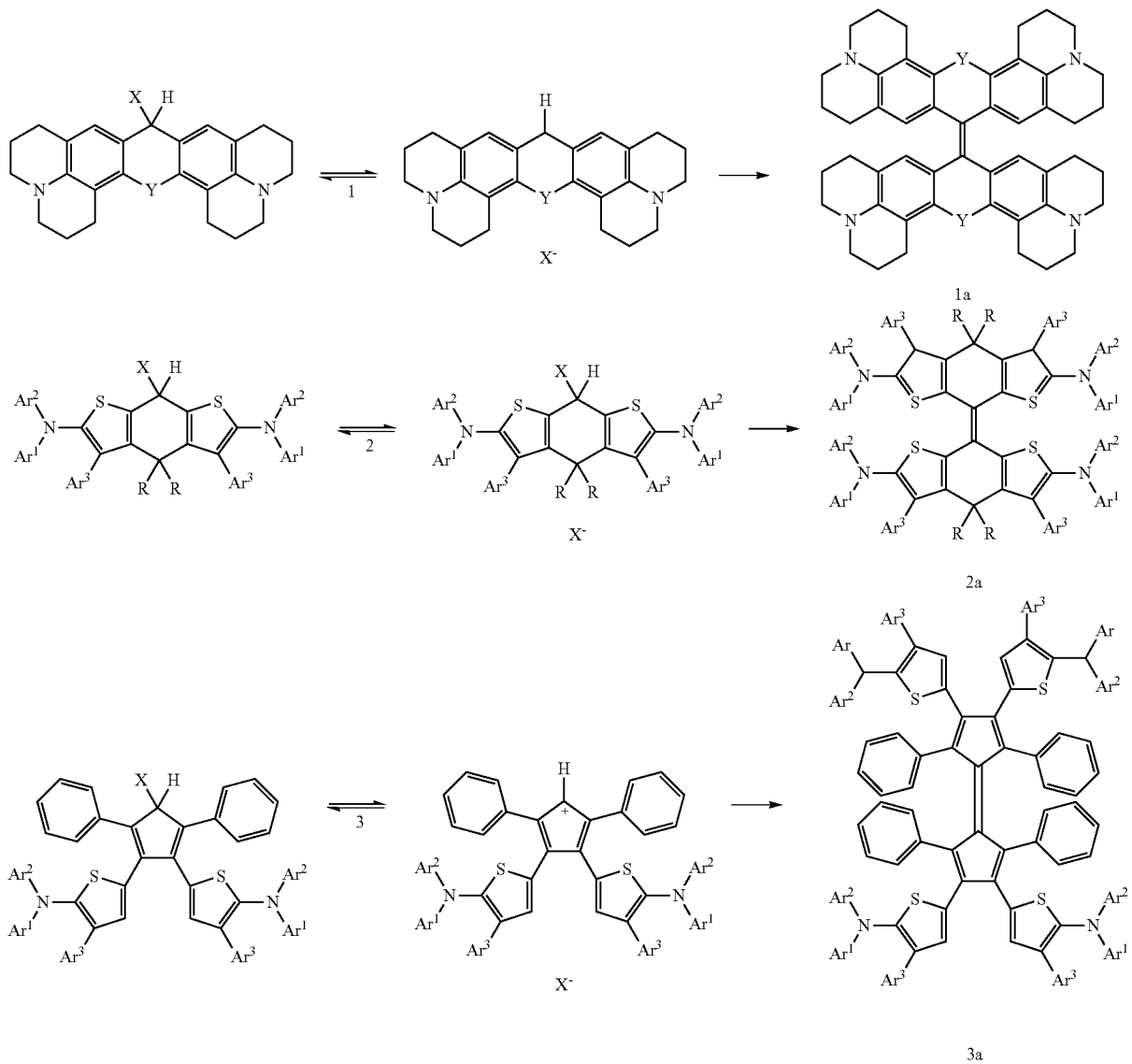

wherein:
X⁻ is an anion;
Y is S or N—Ar;
R is alkyl; and,
Ar¹, Ar², and Ar³ are each, independently, aryl moieties.

12. The process of claim 11, wherein the Ar in N—Ar is phenyl or 1-naphthyl.

13. The process of claim 11, wherein X⁻ is chloride or formiate.

14. The process of claim 11, wherein R is methyl.

15. The process of claim 11, wherein Ar¹, Ar², and Ar³ are each independently selected from the group consisting of phenyl, 1-naphthyl and 2-naphthyl.

* * * * *

UNITED STATES PATENT AND TRADEMARK OFFICE
CERTIFICATE OF CORRECTION

| | | |
|---|---|---|
| PATENT NO. | : 8,221,903 B2 | Page 1 of 3 |
| APPLICATION NO. | : 12/065859 | |
| DATED | : July 17, 2012 | |
| INVENTOR(S) | : Andreas Kanitz | |

It is certified that error appears in the above-identified patent and that said Letters Patent is hereby corrected as shown below:

In the Specifications:

Columns 1-2

Lines 55-65 (approx.), delete " ... " insert -- ... --

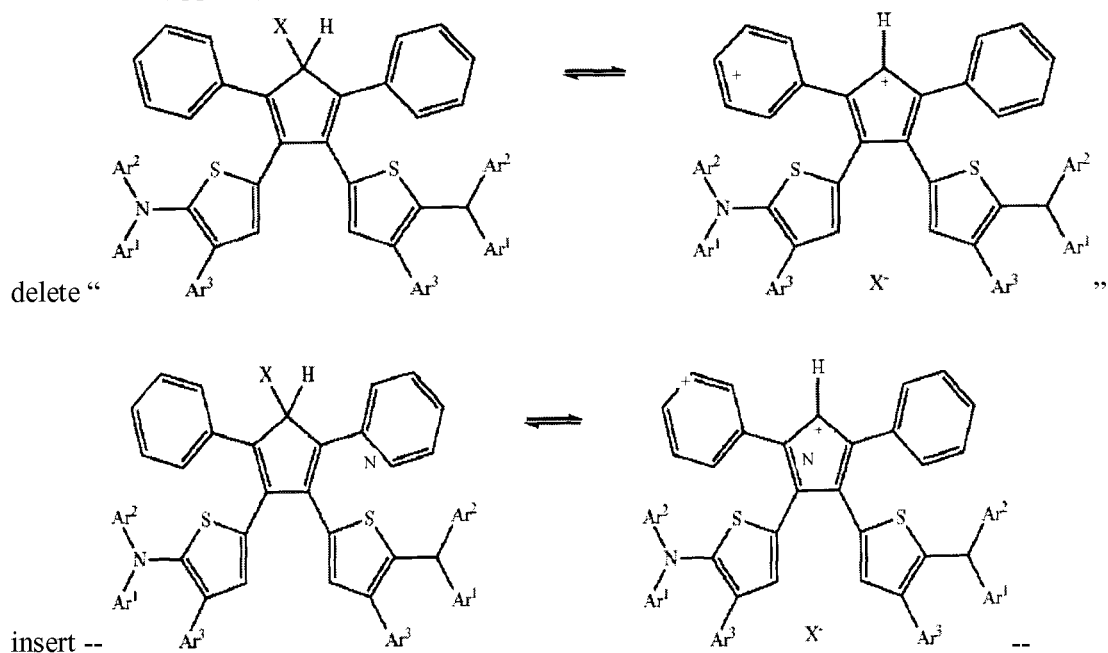

Signed and Sealed this
Sixteenth Day of July, 2013

Teresa Stanek Rea
*Acting Director of the United States Patent and Trademark Office*

CERTIFICATE OF CORRECTION (continued)
U.S. Pat. No. 8,221,903 B2

In the Claims:

Column 7

Claim 1, lines 35-40 (approx.), delete " 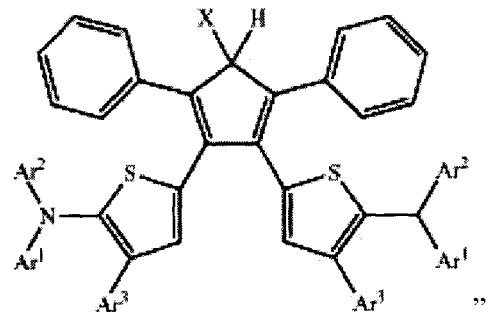 "

and insert -- 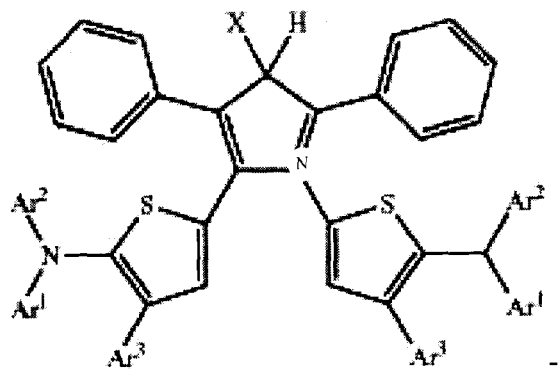 --

Claim 1, lines 45-55 (approx.), delete " 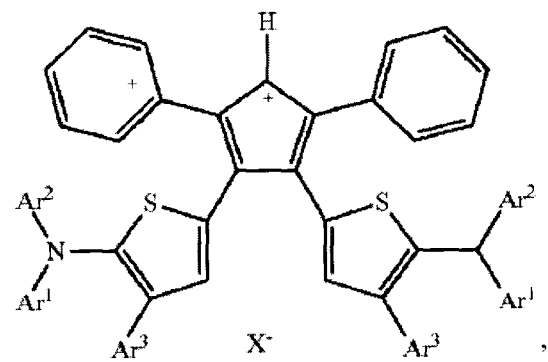 "

and insert -- 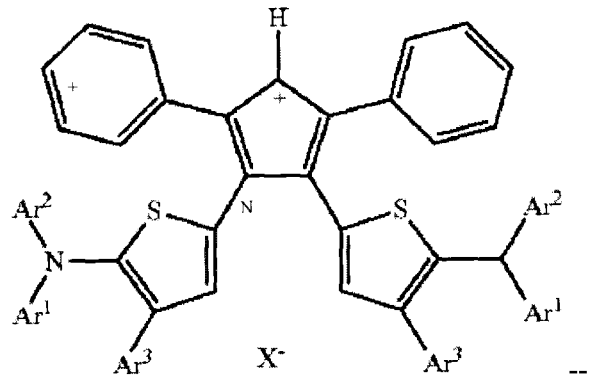 --

CERTIFICATE OF CORRECTION (continued)
U.S. Pat. No. 8,221,903 B2

Columns 9-10

Claim 11, lines 10-15 (approx.), delete " 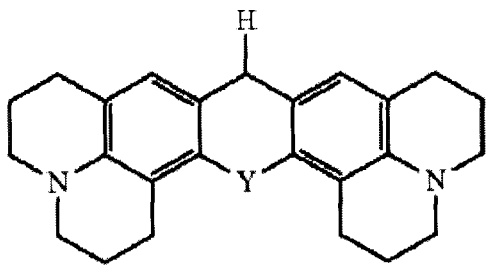 "

and insert -- 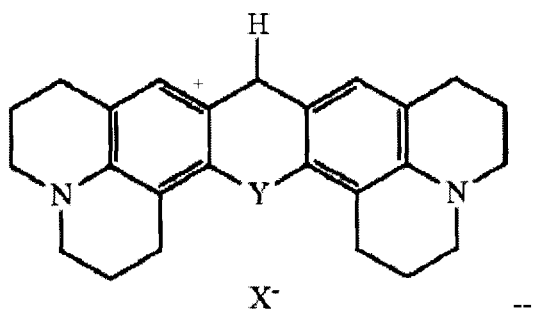 --

Claim 11, lines 20-25 (approx.), delete " 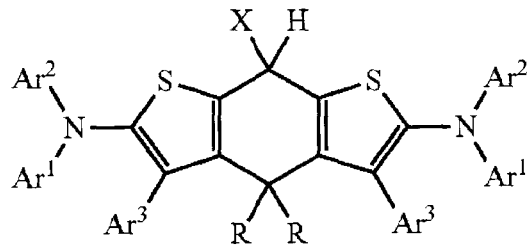 "

and insert -- 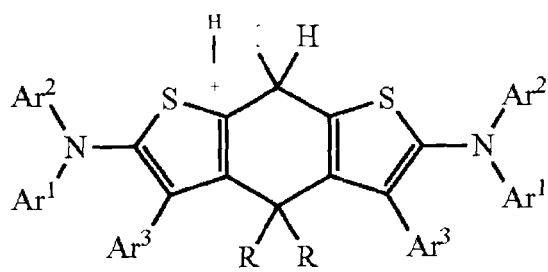 --

UNITED STATES PATENT AND TRADEMARK OFFICE
CERTIFICATE OF CORRECTION

PATENT NO. : 8,221,903 B2  
APPLICATION NO. : 12/065859  
DATED : July 17, 2012  
INVENTOR(S) : Andreas Kanitz Page 1 of 3

It is certified that error appears in the above-identified patent and that said Letters Patent is hereby corrected as shown below:

In the Specification

Columns 1-2

Lines 55-65 (approx.), delete " 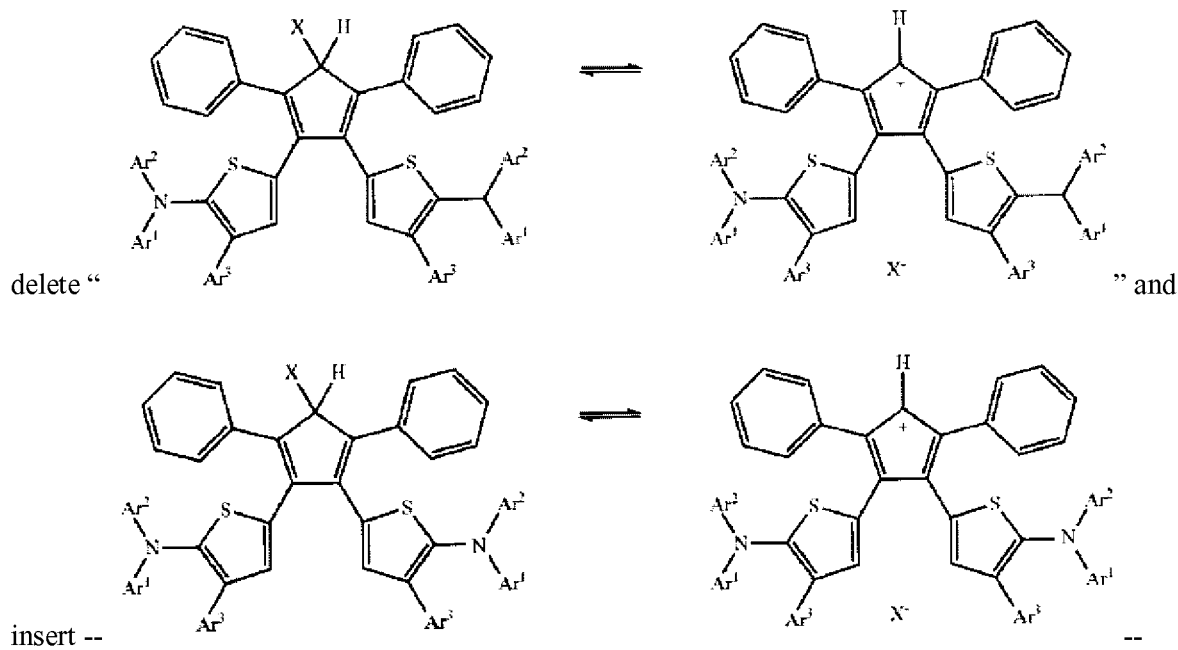 " and insert --

Signed and Sealed this  
Third Day of February, 2015

Michelle K. Lee  
*Deputy Director of the United States Patent and Trademark Office*

CERTIFICATE OF CORRECTION (continued)
U.S. Pat. No. 8,221,903 B2

In the Claims

<u>Column 7</u>

Claim 1, lines 35-40 (approx.), delete " 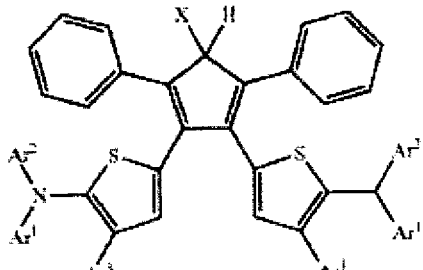 " and insert -- 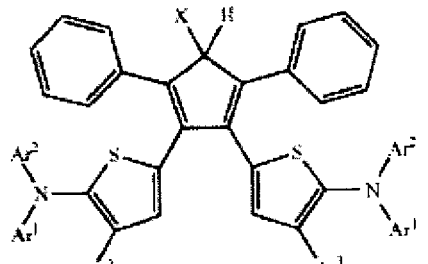 --

Claim 1, lines 45-55 (approx.), delete " 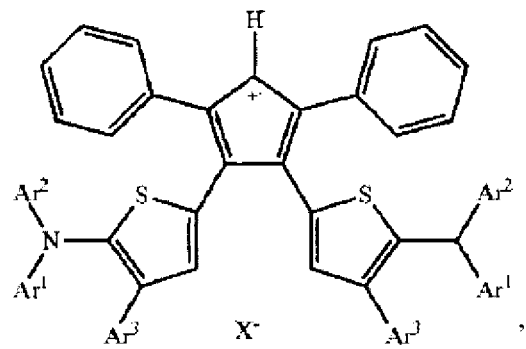 " and insert -- 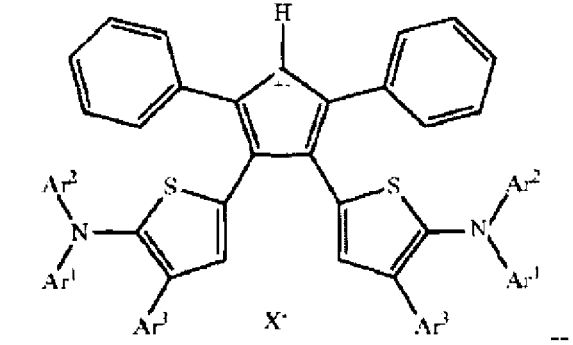 --

CERTIFICATE OF CORRECTION (continued)
U.S. Pat. No. 8,221,903 B2

Columns 9-10

Claim 11, lines 10-15 (approx.), delete " 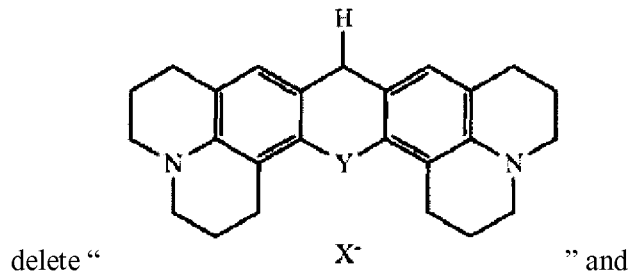 " and insert -- 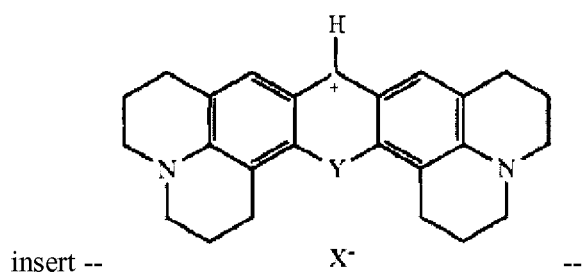 --

Claim 11, lines 20-25 (approx.), delete " 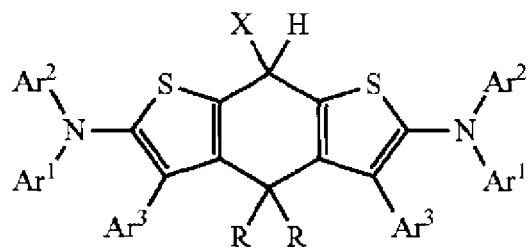 " and insert -- 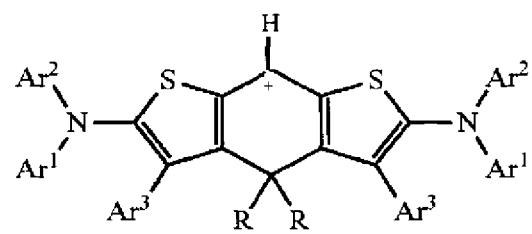 --